United States Patent
McKay et al.

(10) Patent No.: US 12,355,431 B2
(45) Date of Patent: Jul. 8, 2025

(54) SWITCH WITH BACK GATE-CONNECTED COMPENSATION CAPACITORS

(71) Applicant: GlobalFoundries U.S. Inc., Malta, NY (US)

(72) Inventors: Thomas G. McKay, Boulder Creek, CA (US); Gail B. Katzman, Boulder Creek, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 170 days.

(21) Appl. No.: 18/158,572

(22) Filed: Jan. 24, 2023

(65) Prior Publication Data

US 2024/0267042 A1  Aug. 8, 2024

(51) Int. Cl.
*H03K 17/16* (2006.01)
*H03K 3/012* (2006.01)

(52) U.S. Cl.
CPC .......... *H03K 17/161* (2013.01); *H03K 3/012* (2013.01)

(58) Field of Classification Search
CPC .............................. H03K 17/161; H03K 3/012
See application file for complete search history.

(56) References Cited

U.S. PATENT DOCUMENTS

| | | | |
|---|---|---|---|
| 7,235,424 B2 | 6/2007 | Chen et al. | |
| 7,910,993 B2 * | 3/2011 | Brindle | H01L 29/78615 257/347 |
| 8,008,988 B1 | 8/2011 | Yang et al. | |
| 8,054,143 B2 * | 11/2011 | Takahashi | H03K 19/0005 327/427 |
| 8,536,636 B2 | 9/2013 | Englekirk | |
| 9,190,994 B2 | 11/2015 | Hurwitz | |
| 9,438,223 B2 | 9/2016 | de Jongh | |
| 9,923,594 B2 * | 3/2018 | Madan | H03K 17/162 |
| 2011/0254612 A1 | 10/2011 | Kinoshita et al. | |
| 2013/0321061 A1 | 12/2013 | Chen | |
| 2015/0263726 A1 | 9/2015 | Agrawal | |

(Continued)

OTHER PUBLICATIONS

European Search Report for corresponding EP Application No. 23194266.5-1020 dated Feb. 6, 2024, 8 pages.

*Primary Examiner* — Menatoallah Youssef
*Assistant Examiner* — Colleen J O Toole
(74) *Attorney, Agent, or Firm* — Yee Tze Lim; Hoffman Warnick LLC

(57) ABSTRACT

A disclosed structure (e.g., a switch circuit) includes multiple transistors (e.g., on triple wells) connected in series between a first and second nodes. Each transistor can include a primary gate (e.g., a front gate) for controlling the ON/OFF state of the transistor and a secondary gate (e.g., a back gate) for adjusting the VT of the transistor. The switch circuit further includes multiple capacitors (e.g., APMOM capacitors on triple wells), each connected to the second node and to the secondary gate of a corresponding one of the transistors. In advanced semiconductor-on-insulator processing technology platforms, each secondary gate includes a well region within a semiconductor substrate and a corresponding section of an insulator layer, which is on the semiconductor substrate and adjacent to an active device region for the transistor. The capacitors are preselected during design and different capacitances for limiting parasitic secondary gate-to-substrate coupling. Also disclosed are associated methods.

16 Claims, 11 Drawing Sheets

(56) References Cited

U.S. PATENT DOCUMENTS

| | | |
|---|---|---|
| 2016/0336278 A1 | 11/2016 | Petzold et al. |
| 2018/0083577 A1 | 3/2018 | Wagh et al. |
| 2019/0288006 A1 | 9/2019 | Paul et al. |
| 2021/0194125 A1* | 6/2021 | Bellaouar ............... H03F 3/195 |
| 2021/0242127 A1* | 8/2021 | Goktepeli ............... H01L 28/60 |
| 2021/0313982 A1 | 10/2021 | Lin |

* cited by examiner

SWITCH WITH BACK GATE-CONNECTED COMPENSATION CAPACITORS

BACKGROUND

The present embodiments relate to radio frequency (RF) switches and, more particularly, to embodiments of an RF switch and a method of forming the RF switch.

Various factors considered in modern integrated circuit (IC) design include, but are not limited to, performance improvement, size scaling, and power consumption. Oftentimes design changes with respect to one of these factors can result in an undesirable trade-off with respect to one or more of the other factors. For example, designs for RF switches with stacked field effect transistors (FETs) have been developed using advanced semiconductor-on-insulator processing technology platforms (e.g., a fully depleted silicon-on-insulator (FDSOI) processing technology platform) that include ultra-thin semiconductor and insulator layers (e.g., silicon and buried oxide layers) stacked on a base semiconductor substrate (e.g., a silicon substrate). Advantages of such RF switch designs include, for example, FET size scaling and optional back gate biasing (e.g., forward back biasing (FBB) or reverse back biasing (RBB)) to fine tune the threshold voltages (VTs) of the FETs and thereby improve RF switch performance. However, if the number of stacked FETs within the RF switch is increased to improve high RF voltage handling or other performance parameters, parasitic capacitance to the semiconductor substrate increases with each additional back gate of each additional FET. The increase in parasitic capacitance to the semiconductor substrate modulates the on resistance (Ron) and introduces deleterious soft compression.

SUMMARY

Disclosed are embodiments of a structure (e.g., a switch structure). The structure can include transistors connected in series between a first node and a second node. Each transistor can have a primary gate and a secondary gate. The structure can further include capacitors. Each capacitor can be electrically connected to the second node and to the secondary gate of one of the transistors.

In some embodiments, the structure can specifically include a semiconductor substrate having a first surface and a second surface opposite the first surface. The semiconductor substrate can include well regions at the second surface, extending a first depth into the semiconductor substrate, and physically separated from the first surface. The semiconductor substrate can also include additional well regions. The additional well regions can be within the well regions, respectively, at the second surface, can have a different type conductivity than the well regions, and can extend a second depth, which is less than the first depth, into the semiconductor substrate. The structure can further include an insulator layer on the second surface of the semiconductor substrate and a semiconductor layer on the insulator layer. The structure can also include transistors connected in series between a first node and a second node. Each transistor can include an active device region in the semiconductor layer, a primary gate on the active device region opposite the insulator layer, and a secondary gate including a section of the insulator layer adjacent to the active device region and one of the additional well regions. The structure can also include capacitors. Each capacitor can be electrically connected to the second node and an additional well region of a secondary gate of one of the transistors.

Also disclosed herein are embodiments of a method. The method can include generating, by a processor, a capacitance model for a structure that includes transistors connected in series between a first node and a second node, wherein each transistor has a primary gate and a secondary gate. The method can further include editing, by the processor, a design for the structure based on the capacitance model. This editing process can include inserting capacitors into the design with each capacitor being connected to the second node and to the secondary gate of a corresponding one of the transistors. The method can further include outputting, by the processor, the design for manufacturing the structure.

BRIEF DESCRIPTION OF THE DRAWINGS

The present disclosure will be better understood from the following detailed description with reference to the drawings, which are not necessarily drawn to scale and in which.

DETAILED DESCRIPTION

As mentioned above, designs for RF switches with stacked FETs have been developed using advanced semiconductor-on-insulator processing technology platforms, such as FDSOI. Advantages of such RF switch designs include, for example, FET size scaling and optional back gate biasing (e.g., FBB or RBB) to fine tune the threshold voltages (VTs) of the FETs and thereby improve RF switch performance. However, if the number of stacked FETs within the RF switch is increased to improve high RF voltage handling or other performance parameters, overall parasitic capacitance to the semiconductor substrate increases with each additional back gate of each additional FET. The increase in parasitic capacitance to the semiconductor substrate modulates the on resistance (Ron) and introduces deleterious soft compression.

In view of the foregoing, disclosed herein are embodiments of structure and, particularly, a switch circuit (e.g., an RF switch circuit) with secondary gate-connected compensation capacitors. Specifically, in the disclosed embodiments, the switch circuit can include multiple transistors connected in series between a first node and a second node. Each transistor can include a primary gate (e.g., a front gate) for controlling the ON/OFF state of the transistor and a secondary gate (e.g., a back gate) for adjusting the VT of the transistor. The switch circuit can further include multiple capacitors, each connected to the second node and to the secondary gate of a corresponding one of the transistors. In advanced semiconductor-on-insulator processing technology platforms, such as FDSOI, each secondary gate can include a well region within a semiconductor substrate and a corresponding section of an insulator layer, which is on the semiconductor substrate and adjacent to an active device region for the transistor, and the capacitors can be preselected during design and can have different capacitances in order to compensate for and, particularly, limit parasitic capacitance between the secondary gates and the semiconductor substrate (i.e., secondary gate-to-substrate parasitic capacitances) and, thereby limit Ron modulations and soft compression caused thereby. By including such capacitors in the structure, the number of transistors in the chain can be increased during design in order to meet RF voltage handling requirements or other performance parameters without seeing a significant corresponding increase in Ron modulation or soft compression. Also disclosed herein are associated method embodiments.

Figure 1:
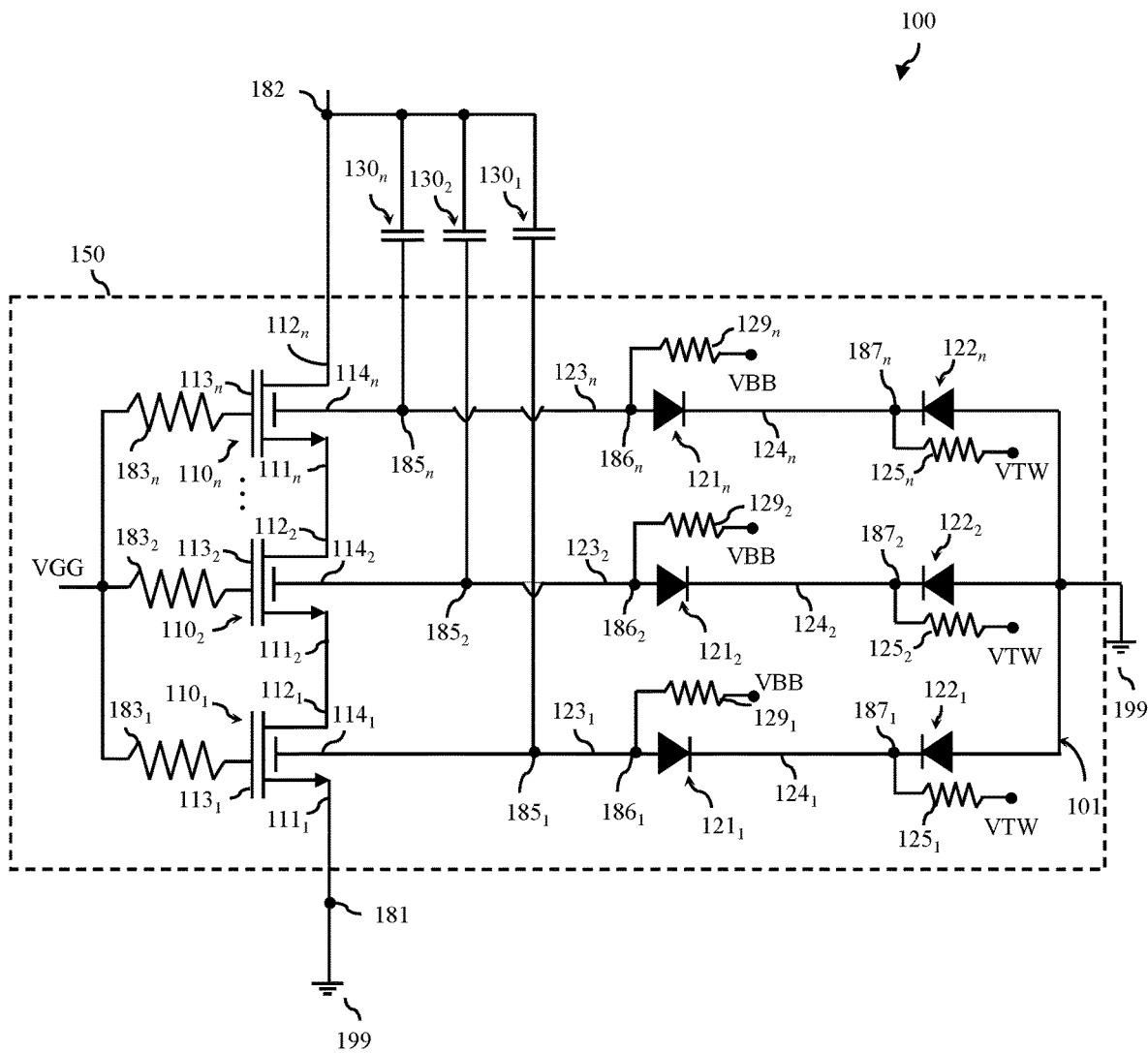
FIG. 1 is a schematic diagram illustrating disclosed embodiments of a structure.
Figure 2A:
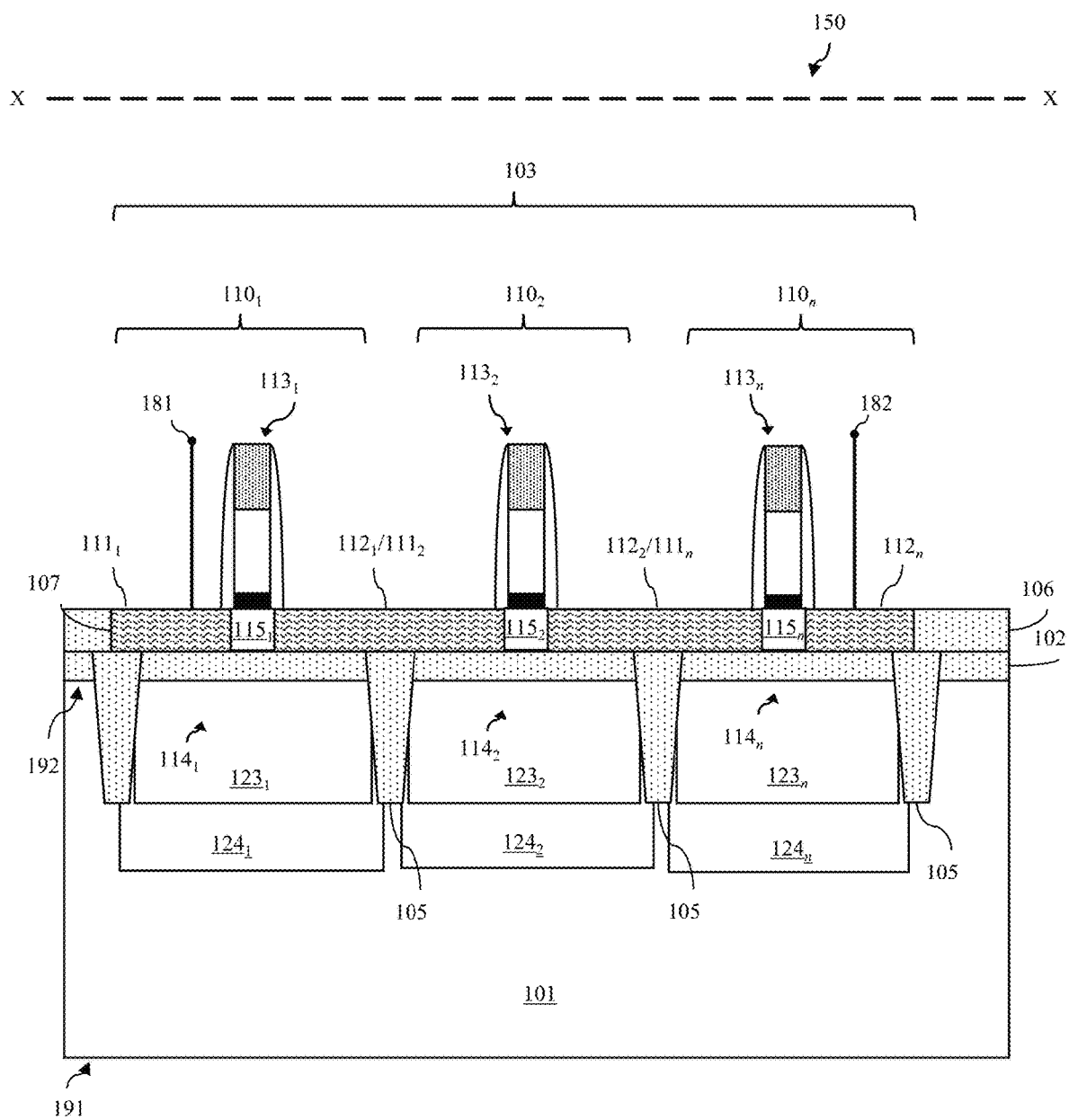
FIGS. 2A and 2B are cross-section and layout diagrams, respectively, illustrative of a chain of transistors incorporated into the structure of FIG. 1.
Figure 2B:
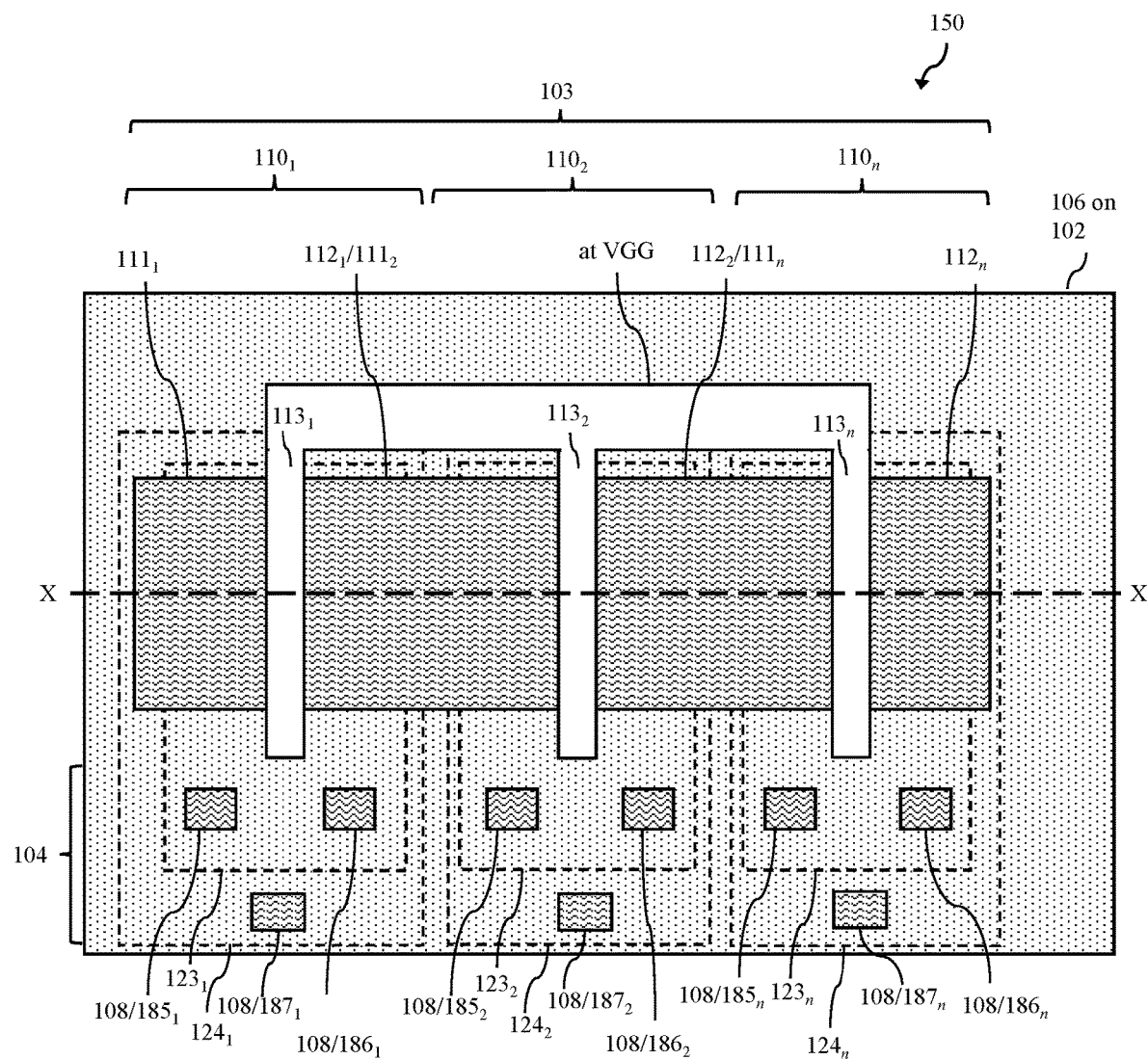

FIG. 1 is a schematic diagram illustrating disclosed embodiments of a structure 100 and, particularly, of a switch circuit, such as an RF switch circuit, including a chain 150 of transistors $110_1$-$110_n$. FIGS. 2A and 2B are illustrative of cross-section and layout diagrams, respectively, of a portion of the structure 100 including the chain 150 of transistors $110_1$-$110_n$ as manufactured using an advanced semiconductor-on-insulator technology platform (e.g., an FDSOI technology platform).

Referring to the schematic diagram of FIG. 1, in the disclosed embodiments, the structure 100 can include a chain 150 of transistors $110_1$-$110_n$ connected in series between a first node 181, which is, for example, connected to ground (GND) 199, and a second node 182. For purposes of illustration, the chain 150 is shown in the figures as including three transistors connected in series between the nodes 181-182. However, it should be understood that the figures are not intended to be limiting and that, alternatively, the chain 150 can include any number of two or more transistors connected between the nodes 181-182 with a first transistor $110_1$ in the chain 150 being connected to the first node 181 and with a last transistor $110_n$ in the chain 150 being connected to the second node 182. Each transistor $110_1$-$110_n$ can include a first source/drain region $111_1$-$111_n$, a second source/drain region $112_1$-$112_n$, and a channel region $115_1$-$115_n$ between the first source/drain region and the second source/drain region.

The transistors $110_1$-$110_n$ can be N-channel field effect transistors (NFETs) (as illustrated). In this case, the first source/drain region $111_1$-$111_n$ and the second source/drain region $112_1$-$112_n$ can have N-type conductivity at a relatively high conductivity level (i.e., N+ source/drain regions) and the channel region $115_1$-$115_n$ can be either an intrinsic channel region (i.e., an undoped channel region) or, alternatively, can be doped so as to have P-type conductivity at a relatively low conductivity level (e.g., a P− channel region). Alternatively, the transistors $110_1$-$110_n$ could be P-channel field effect transistors (PFETs). In this case, the first source/drain region $111_1$-$111_n$ and the second source/drain region $112_1$-$112_n$ can have P-type conductivity at a relatively high conductivity level (i.e., P+ source/drain regions) and the channel region $115_1$-$115_n$ can be either an intrinsic channel region (i.e., an undoped channel region) or, alternatively, can be doped so as to have N-type conductivity at a relatively low conductivity level (e.g., an N− channel region). Additionally, each transistor $110_1$-$110_n$ can be a dual gate transistor. Specifically, each transistor $110_1$-$110_n$ can further include a primary gate $113_1$-$113_n$ (e.g., a front gate) on one surface of the channel region $115_1$-$115_n$ between the source/drain regions. Each primary gate $113_1$-$113_n$ can be electrically connected to a relatively large resistor $183_1$-$183_n$ for receiving a primary gate voltage (VGG) used to control the ON/OFF states of the transistors $110_1$-$110_n$. Each transistor $110_1$-$110_n$ can further include a secondary gate $114_1$-$114_n$ (e.g., a back gate) on an opposite surface of the channel region $115_1$-$115_n$ between source/drain regions. Each secondary gate $114_1$-$114_n$ can further be electrically connected to a relatively large resistor $129_1$-$129_n$ for receiving a secondary gate voltage (also referred to herein as a back gate voltage (VBB)) for FBB or RBB to fine tune the VTs of the transistors $110_1$-$110_n$. Those skilled in the art will recognize that FBB refers to back biasing that reduces VT. For example, for a P− channel field effect transistor (PFET), −VBB could be applied to reduce the VT, whereas, for an N-channel field effect transistor (NFET), a +VBB could be applied to reduce the VT. RBB refers to back biasing that increases VT. For example, for an NFET, −VBB could be applied to increase the VT, whereas, for a PFET, a +VBB could be applied to increase the VT.

As discussed in greater detail below with regard to FIGS. 2A-2B and the design method, the transistors $110_1$-$110_n$ can all be essentially identical transistors of the same size. Alternatively, the first transistor $110_1$ in the chain 150 and any additional transistor up to the last transistor $110_n$ in the chain 150 can be essentially identical transistors of the same size and they can be larger than the last transistor $110_n$. For example, the last transistor $110_n$ can be ½ the size of all other transistors in the chain 150 or some other proportion (e.g., ¼, ⅜, ¾, etc.) of all other transistors in the chain 150. Alternatively, the transistors $110_1$ to $110_n$ in the chain 150 decrease in size between the first node 181 and the second node 182.

The structure 100 can further include capacitors $130_1$-$130_n$ for each of the transistors $110_1$-$110_n$, respectively. More specifically, each capacitor $130_1$-$130_n$ can have a first terminal electrically connected to the secondary gate $114_1$-$114_n$ of a corresponding one of the transistors $110_1$-$110_n$ and a second terminal connected to the second node 182 at the top of the chain 150. These capacitors $130_1$-$130_n$ can be, for example, high voltage alternate polarity metal-oxide-metal (APMOM) capacitors. APMOM capacitors can have interdigitated metal or metal alloy first and second terminals of opposite polarities and "fingers" of the terminals can be separated by a thin oxide layer. Optimally, in FDSOI, the capacitors $130_1$-$130_n$ can be APMOM capacitors, which are specifically located over triple wells (e.g., in the same manner as transistor $110_1$-$110_n$ placement discussed above) and which are biasable to a positive voltage to allow for a larger maximum compensated stack height (i.e., a larger number of n transistors) and lower overall capacitances (as discussed in greater detail below with regard to the method embodiments). Alternatively, these capacitors $130_1$-$130_n$ can be any other type of capacitor suitable for high voltage RF operation including, but not limited to, other metal-oxide-metal (MOM) capacitors or metal-insulator-metal (MIM) capacitors. Those skilled in the art will recognize that such capacitors are typically formed in the back end of the line (BEOL) metal levels. Various different capacitor configurations suitable for high voltage RF operation are well known in the art and, thus, the details thereof have been omitted from this specification in order to allow the reader to focus on the salient aspects of the disclosed embodiments. In any case, the capacitors $130_1$-$130_n$ can specifically be different size capacitors with different capacitances. The different capacitances can be, for example, increasing capacitances between a first capacitor $130_1$, which is connected between the secondary gate $114_1$ of the first transistor $110_1$ and the second node 182, and a last capacitor $130_n$, which is connected between the secondary gate $114_n$ of the last transistor $110_n$ and the second node 182. In any case, as discussed below regarding the disclosed method, these different size capacitors $130_1$-$130_n$ can be selected to compensate for parasitic capacitances between the transistors $110_1$-$110_n$ and, particularly, between the secondary gates $114_1$-$114_n$ thereof and a semiconductor substrate 101 on which they are formed and, thereby to minimize deleterious effects (e.g., Ron modulation and soft compression). By including such capacitors in the structure, the number of transistors in the chain 150 can be increased during design in order to meet RF voltage handling requirements or other performance parameters without seeing a corresponding significant increase in Ron modulation or soft compression.

More particularly, as mentioned above, FIGS. 2A and 2B are illustrative of cross-section and layout diagrams, respectively, of a portion of the structure 100 and, particularly, the chain 150 of transistors thereof as manufactured using an advanced semiconductor-on-insulator technology platform (e.g., an FDSOI technology platform).

Referring to FIGS. 2A-2B in combination with FIG. 1, a structure 100 formed in an advanced semiconductor-on-insulator technology platform such as in the FDSOI technology platform can include a base semiconductor substrate 101, which is monocrystalline in structure and has a first surface 191 (also referred to herein as a back or bottom surface) and a second surface 192 (also referred to herein as a front or top surface) opposite the first surface 191. The base semiconductor substrate 101 can be, for example, a monocrystalline silicon (Si) substrate or some other suitable monocrystalline semiconductor substrate.

The structure 100 can further include semiconductor-on-insulator regions 103 (e.g., silicon-on-insulator (SOI) regions) and bulk semiconductor regions 104 (also referred to as hybrid semiconductor regions) on the base semiconductor substrate 101. Each semiconductor-on-insulator region 103 can include insulator layer 102 above and immediately adjacent to the second surface 192 of the base semiconductor substrate 101. The insulator layer 102 can be, for example, a SiO2 layer or a layer of any other suitable insulator material. Each semiconductor-on-insulator region 103 can further include a thin monocrystalline semiconductor layer 107 on the insulator layer 102. The monocrystalline semiconductor layer 107 can be, for example, a thin monocrystalline Si layer or a layer of some other suitable monocrystalline semiconductor material. Each bulk semiconductor region 104 can include a monocrystalline epitaxial semiconductor layer 108 (e.g., a monocrystalline silicon layer) immediately adjacent to the top surface of the base semiconductor substrate. Top surfaces of epitaxial semiconductor layers 108 in the bulk semiconductor regions 104 can be somewhat above, somewhat below or essentially co-planar with the top surface of the monocrystalline semiconductor layers 107 of the semiconductor-on-insulator regions 103.

The various semiconductor-on-insulator and bulk regions can be electrically isolated from each other by isolation regions including, for example, shallow trench isolation (STI) regions 106 that extend vertically through the semiconductor layer 107 to the insulator layer 102 and by deep trench isolation (DTI) regions 105 that extend vertically into the semiconductor substrate 101 at the second surface 192 (e.g., through or from the insulator layer 102). Various STI and DTI structures are well known in the art and, thus, the details thereof have been omitted from this specification in order to allow the reader to focus on the salient aspects of the disclosed embodiments.

Although not specifically shown in FIGS. 2A-2B (but illustrated in FIG. 1), it should be understood that the capacitors $130_1$-$130_n$ of the structure 100 are BEOL devices formed in the BEOL metal levels and, thus, can be above the semiconductor-on-insulator regions 103 and/or bulk semiconductor regions 104. They can be different size capacitors with different capacitances (as discussed in greater detail below with regard to the method embodiments) and they can be connected to the secondary gates of the transistors $110_1$-$110_n$, respectively, in the chain 150 and also to the second node 182 at the top of the chain 150 of transistors (also as discussed in greater detail below).

As illustrated in FIGS. 2A-2B, the chain 150 of transistors $110_1$-$110_n$ can be in a given semiconductor-on-insulator region 103. Contact regions for accessing the semiconductor substrate (e.g., to connect the semiconductor substrate to GND 199) and for accessing well regions within the semiconductor substrate (e.g., to bias the well regions and/or to allow the well regions to be electrically connected to other on-chip components, such as other front end of the line (FEOL), middle of the line (MOL), or BEOL components) can be in one or more of the bulk semiconductor regions 104. For purposes of this disclosure, a well region refers to a doped region (e.g., a dopant implant region) of a semiconductor substrate. A well region can be an Nwell (i.e., a region of a semiconductor substrate doped so as to have N-type conductivity) or a Pwell (i.e., a region of a semiconductor substrate doped so as to have P-type conductivity).

More specifically, within a semiconductor-on-insulator region 103, STI regions 106 can be patterned so as to define the shape of the active device regions for the transistors $110_1$-$110_n$ in the semiconductor layer 107. Each active device region for each transistor $110_1$-$110_n$ can include the first source/drain region $111_1$-$111_n$, the second source/drain region $112_1$-$112_n$ and the channel region $115_1$-$115_n$ positioned laterally between the first and second source/drain regions. The first source/drain region $111_1$ of the first transistor $110_1$ in chain 150 can be electrically connected to the first node 181 and, thereby to GND 199. The second source/drain region $112_n$ of the last transistor $110_n$, in chain 150 can be electrically connected to the second node 182.

As discussed above with regard to FIG. 1, in the chain 150, the transistors $110_1$-$110_n$ can be NFETs with N+ source/drain regions and an intrinsic or P− channel region between the N+ source/drain regions. Alternatively, the transistors $110_1$-$110_n$ could be PFETs. Additionally, in some embodiments, the transistors $110_1$-$110_n$ can all be essentially identical transistors of the same size. In other embodiments, the first transistor $110_1$ in the chain 150 and any additional transistor up to the last transistor $110_n$ in the chain 150 can be essentially identical transistors of the same size and they can further be larger than the last transistor $110_n$. For example, the last transistor $110_n$, can be ½ the size of all other transistors in the chain 150 or some size (e.g., ¼, ⅜, ¾, etc. the size of the other transistors in the chain).

As illustrated in FIGS. 2A-2B, the active device regions of the transistors can include continuous portions of the semiconductor layer 107 such that the second source/drain region $112_1$ of the first transistor $110_1$ and the first source/drain region $111_2$ of the second transistor $110_2$ form a common source/drain region (also referred to herein as a shared source/drain region), the second source/drain region $112_2$ of the second transistor $110_2$ and the first source/drain region of the next transistor form a common source/drain region, and so on. Thus, these transistors $110_1$-$110_n$ are electrically connected in series. Alternatively, the active device regions can be discrete active device regions laterally surrounded by STI region and the series connections between the transistors can be achieved through local and/or BEOL interconnects (not shown).

As illustrated in FIGS. 2A-2B, the transistors $110_1$-$110_n$ can all be dual gate transistors. Specifically, each transistor $110_1$-$110_n$ can include a primary gate $113_1$-$113_n$ (e.g., a front gate) and a secondary gate $114_1$-$114_n$ (e.g., a back gate).

The primary gate $113_1$-$113_n$ can be on the top surface of semiconductor layer 107 adjacent to the channel region $115_1$-$115_n$ within the corresponding active device region for that device. For example, as illustrated in the layout diagram of FIG. 2B, a front gate structure can include a main body on an STI region and oriented parallel to the active device regions and extensions for each primary gate $113_1$-$113_n$ perpendicular to the main body extend extending laterally across the channel regions within the respective active device regions. Thus, the main body can be a common primary gate node and can be contacted so that each primary gate $113_1$-$113_n$ can essentially concurrently receive the same primary gate voltage (VGG) used to control the ON/OFF states of the transistors $110_1$-$110_n$.

Such a front gate structure can be a patterned gate-first polysilicon gate stack, which includes, for example: a silicon dioxide gate dielectric layer; a doped polysilicon gate conductor layer on the silicon dioxide gate dielectric layer; and, optionally, a metal silicide layer (e.g., cobalt silicide (CoSi), nickel silicide (NiSi), tungsten silicide (WSi), titanium silicide (TiSi), or any other suitable metal silicide material layer) on the doped polysilicon gate conductor layer. Alternatively, the front gate structure could be a patterned gate-first high-K metal gate (HKMG) stack, which includes, for example: an interfacial layer (e.g., a silicon oxynitride layer) on the semiconductor layer; a high-K gate dielectric layer (i.e., a layer of dielectric material with a dielectric constant that is greater than 3.9 including, for example, hafnium (Hf)-based dielectrics, such as hafnium oxide, hafnium silicon oxide, hafnium silicon oxynitride, or hafnium aluminum oxide, or other suitable high-k dielectrics, such as aluminum oxide, tantalum oxide, or zirconium oxide) on the interfacial layer; one or more stacked metal layers (e.g., a metal capping layer and an additional metal material layer suitable for dipole formation on the metal capping layer) on the high-K gate dielectric layer; an optional doped polysilicon gate conductor layer on the metal gate conductor layer(s); and an optional metal silicide layer, on the doped polysilicon gate conductor layer. Alternatively, the front gate structure could be any other suitable type of gate stack (e.g., a replacement metal gate (RMG) structure), which includes, for example: a high-K gate dielectric layer; a work function metal layer on the high-K gate dielectric layer; an optional doped polysilicon gate conductor layer on the work function metal layer; and an optional metal silicide layer, on the doped polysilicon gate conductor layer.

Various different gate-first and replacement front gate structures for FDSOI are known in the art. However, as discussed above, those skilled in the art will recognize that the configuration of the front gate structure can vary depending upon whether the FET is an NFET or a PFET. For example, the optimal effective work function for the gate structure of an NFET is between about 3.9 eV and about 4.2 eV, whereas the optimal effective work function for the gate structure of a PFET is between about 4.9 eV and about 5.2 eV. In a gate-first polysilicon gate stack, the desired effective work function can be achieved, for example, by doping the polysilicon gate conductor layer with different dopants. For example, in an NFET, the polysilicon gate conductor layer can be doped with an N-type dopant (e.g., phosphorous (P), arsenic (As) or antimony (Sb)). In a PFET, the polysilicon gate conductor layer can be doped with P-type dopant (e.g., boron (B)). In a gate-first HKMG, the desired effective work function can be achieved, for example, using different metal layers on the high-K gate dielectric layer. For example, in an NFET, the metal layers on the high-K gate dielectric layer can include a titanium nitride (TiN) capping layer and, on the TiN capping layer, a lanthanum (La) layer for optimal NFET-specific dipole formation. In a PFET, the metal layers on the high-K gate dielectric layer can include a TiN capping layer and, on the TiN capping layer, an aluminum (Al) layer for optimal PFET-specific dipole formation. In an RMG, the desired effective work function can be achieved, for example, using different work function metal layers immediately adjacent to the high-K gate dielectric layer. Metals and metal alloys, which have a work function within the range optimal for NFET performance (i.e., between 3.9 eV and about 4.2 eV) include, but are not limited to, hafnium, zirconium, titanium, tantalum, aluminum, and alloys thereof, such as, hafnium carbide, zirconium carbide, titanium carbide, tantalum carbide, and aluminum carbide. Metals and metal alloys, which have a work function within the range optimal for PFET performance (i.e., between about 4.9 eV and about 5.2 eV) include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Such front gate structures and the techniques for forming them are well known in the art and, thus, the details thereof have been omitted from this specification in order to allow the reader to focus on the salient aspects of the disclosed embodiments.

The secondary gate $114_1$-$114_n$ can be adjacent to the channel region $115_1$-$115_n$ opposite the primary gate $113_1$-$113_n$. That is, the secondary gate $114_1$-$114_n$ can be a back gate on the back side of the channel region.

Specifically, the semiconductor substrate 101 can, for example, be doped so as to have P-type conductivity at a relatively low conductivity level (e.g., so as to be a P-semiconductor substrate) and can further be electrically connected to GND 199. The semiconductor substrate 101 can further include well regions $124_1$-$124_n$. As mentioned above, a well region refers to a doped region (e.g., a dopant implant region or otherwise) in the semiconductor substrate. It can be doped with a particular dopant so that it has P-type conductivity at some desired conductivity level (e.g., so it is a Pwell) or so that it has N-type conductivity at some desired conductivity level (e.g., so it is an Nwell). Dopants that could be used for achieving different type conductivities in different semiconductor materials are discussed in greater detail below. The well regions $124_1$-$124_n$ can have a different type conductivity than the substrate. For example, the well regions $124_1$-$124_n$ can be Nwells. The well regions $124_1$-$124_n$ can be aligned below the insulator layer 102 opposite the active device regions of the transistors $110_1$-$110_n$, respectively. The well regions $124_1$-$124_n$, can further be physically separated from each other (e.g., by portions of the P- substrate) and can extend into the semiconductor substrate 101 from the second surface 192 to some first depth so as to be above and physically separated from the first surface 191 (e.g., by a lower portion of the P- substrate).

The semiconductor substrate 101 can further include additional well regions $123_1$-$123_n$, one for each transistor $110_1$-$110_n$, within the well regions $124_1$-$124_n$, respectively. Each additional well region $123_1$-$123_n$ can be aligned below the active device region of the corresponding transistor $110_1$-$110_n$ within a corresponding well region $124_1$-$124_n$. Each additional well region $123_1$-$123_n$ can be physically separated from the boundaries of the well region $124_1$-$124_n$ within which it sits and, thus, can be physically separated from the well regions and additional well regions of adjacent transistors. Each additional well region $123_1$-$123_n$ can extend into the semiconductor substrate 101 from the second surface 192 to some second depth that is less than the first depth of the well regions $124_1$-$124_n$. The additional well regions $123_1$-$123_n$ can have a different type conductivity than the well regions $124_1$-$124_n$. Thus, if the well regions $124_1$-$124_n$ are Nwells, the additional well regions $123_1$-$123_n$ are Pwells. DTI regions 105 can extend into the semiconductor substrate 101 from the second surface 192 to some third depth and can laterally surround the additional well regions $123_1$-$123_n$ so as to further isolate them from each other. Optionally, the third depth of the DTI regions 105 can be less than the first depth of the well regions $124_1$-$124_n$.

With a configuration, as described above, the transistors $110_1$-$110_n$ are referred to in the art as being on triple wells or as triple well transistors because, aligned below each transistor $110_1$-$110_n$, are Nwells within a P– substrate forming isolating diodes $122_1$-$122_n$ and Pwells within the Nwells forming additional isolating diodes $121_1$-$121_n$, respectively. Thus, the Pwells are isolated from each other and from the P– substrate below and the Nwells are also isolated from each other. Optionally, the Nwells (i.e., the well regions $124_1$-$124_n$) can further be connected to relatively large resistors $125_1$-$125_n$ for receiving a triple well bias voltage (VTW). VTW can be applied to the well regions $124_1$-$124_n$, for example, to further isolate the additional well regions $123_1$-$123_n$ from the lower portion of the semiconductor substrate 101.

With this triple well configuration, each section of the insulator layer 102, which is adjacent to an active device region and, particularly, adjacent to a channel region $115_1$-$115_n$ and each additional well region $123_1$-$123_n$ which is aligned below such a section of the insulator layer 102, can function as a gate dielectric layer and a gate conductor layer, respectively, to form a secondary gate $114_1$-$114_n$. Each secondary gate $114_1$-$114_n$ and, particularly, the additional well region $123_1$-$123_n$ thereof can be an isolated back gate structure due to the well regions $124_1$-$124_n$ below and the laterally adjacent DTI regions 105. As discussed above and illustrated in FIG. 1, each secondary gate $114_1$-$114_n$ can be electrically connected to a corresponding resistor $129_1$-$129_n$ to receive VBB for back biasing (e.g., FBB or RBB) in order to fine to the VTs. More specifically, the additional well region $123_1$-$123_n$ of each transistor $110_1$-$110_n$ can be electrically connected (via a corresponding contact region discussed below) to a corresponding resistor $129_1$-$129_n$ to receive VBB. As discussed above and illustrated in FIG. 1, each secondary gate $114_1$-$114_n$ can also be electrically connected to the first terminal of a corresponding capacitor $130_1$-$130_n$ that compensates for parasitic capacitance between the secondary gate $114_1$-$114_n$ and the lower portion of the semiconductor substrate 101 (i.e., that compensates for secondary gate-to-substrate parasitic capacitance). More particularly, the additional well region $123_1$-$123_n$ of each transistor $110_1$-$110_n$ can be electrically connected (via a corresponding contact region discussed below) to the first terminal of a corresponding capacitor $130_1$-$130_n$. Also as discussed above and illustrated in FIG. 1 and further illustrated in FIGS. 2A-2B, the second terminal of each capacitor $130_1$-$130_n$ can be connected to the second node 182 at the top of the chain 150 (which is also electrically connected to the second source/drain region $112_n$ of the last transistor 110n in the chain 150).

The contact regions for accessing the semiconductor substrate (e.g., to connect the semiconductor substrate to GND 199) and for accessing well regions within the semiconductor substrate (e.g., to bias the well regions and/or to allow the well regions to be electrically connected to other on-chip components, such as other front end of the line (FEOL), middle of the line (MOL), or BEOL components) can be in one or more of the bulk semiconductor regions 104 (as shown in FIG. 2B).

The contact regions can include well contact regions $187_1$-$187_n$ (including a doped epitaxial monocrystalline semiconductor layer) above and immediately adjacent to the well regions $124_1$-$124_n$ and laterally surrounded by isolation regions so as to allow the well regions $124_1$-$124_n$ to be electrically connected to resistors $125_1$-$125_n$ for receiving VTW. Well contact regions $187_1$-$187_n$ can have the same type conductivity as well regions $124_1$-$124_n$ but at a higher conductivity level. Thus, for example, if the well regions $124_1$-$124_n$, are Nwells, then the well contact regions $187_1$-$187_n$ can be N+ contact regions.

The contact regions can include at least one additional well contact region in each additional well region $123_1$-$123_n$. For example, the contact regions can include both a first additional well contact region $185_1$-$185_n$ and a second additional well contact region $186_1$-$186_n$ in each additional well region $123_1$-$123_n$. The first additional well contact region $185_1$-$185_n$ (including a doped epitaxial monocrystalline semiconductor layer) can be above and immediately adjacent to the additional well region $123_1$-$123_n$ (e.g., offset from the active device region as illustrated in FIG. 2B) and laterally surrounded by isolation regions so as to allow the additional well region $123_1$-$123_n$ to be electrically connected to a corresponding capacitor $130_1$-$130_n$ in the BEOL metal levels (e.g., through a contact landing on the contact region and, optionally, other interconnect structures (not shown)). The second additional well contact region $186_1$-$186_n$ (including a doped epitaxial monocrystalline semiconductor layer) can similarly be above and immediately adjacent to an additional well region $123_1$-$123_n$ (e.g., offset from the active device region as illustrated in FIG. 2B) and laterally surrounded by isolation regions so as to allow the additional well regions $123_1$-$123_n$ to be electrically connected to resistors $129_1$-$129_n$ for receiving VBB. These additional well contact regions can have the same type conductivity as the additional well regions but at a higher conductivity level. Thus, for example, if the additional well regions are Pwells, then the additional well contact regions can be P+ contact regions.

Although not shown, it should be understood that these contact regions can also include a contact region on the semiconductor substrate (external to the well regions) so as to allow the semiconductor substrate to be electrically connected to GND.

Techniques for forming triple well transistors in advanced semiconductor-on-insulator technology platforms (e.g., FDSOI) are generally known in the art. Thus, the details of such techniques have been omitted form this specification in order to allow the reader to focus on the salient aspects of the disclosed structure embodiments including, but not limited to, a switch (e.g., an RF switch) that includes a chain 150 of such transistors $110_1$-$110_n$ and capacitors $130_1$-$130_n$ connected between the secondary gates $114_1$-$114_n$ (i.e., the back gates) of those transistors, respectively, and a node at the top of the chain.

In the structures described above a semiconductor material refers to a material whose conducting properties can be altered by doping with an impurity. Semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., gallium nitride (GaN), indium phosphide (InP), gallium arsenide (GaAs), or gallium phosphide (GaP)). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A GaN-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

Also disclosed herein are embodiments of a design method (e.g., see the flow diagram of FIG. 3) and a design system 400 (e.g., see the system diagram of FIG. 4) for designing a structure, such as the structure 100 shown in FIGS. 1 and 2A-2B.

As mentioned above, the capacitors $130_1$-$130_n$ in the structure 100 described above are different size capacitors with different capacitances and they are electrically connected to the secondary gates $114_1$-$114_n$ (i.e., the isolated back gates) of the transistors $110_1$-$110_n$, respectively, in the chain 150 and also to the second node 182 at the top of the chain 150 in order to compensate for the parasitic capacitance between the transistors $110_1$-$110_n$ and, particularly, between the secondary gates $114_1$-$114_n$ thereof and the semiconductor substrate 101 to minimize deleterious effects (e.g., on resistance (Ron) modulation and soft compression) that negatively affect switch performance. By including such capacitors $130_1$-$130_n$ in the structure 100, the number of transistors $110_1$-$110_n$ in the chain 150 can be increased during design in order to meet RF voltage handling requirements or other performance parameters without seeing a significant corresponding increase in Ron modulation or soft compression. The disclosed design method and design system embodiments can be used to determine the capacitance values for the capacitors and, thereby, the sizes of those capacitors.

Figure 4:
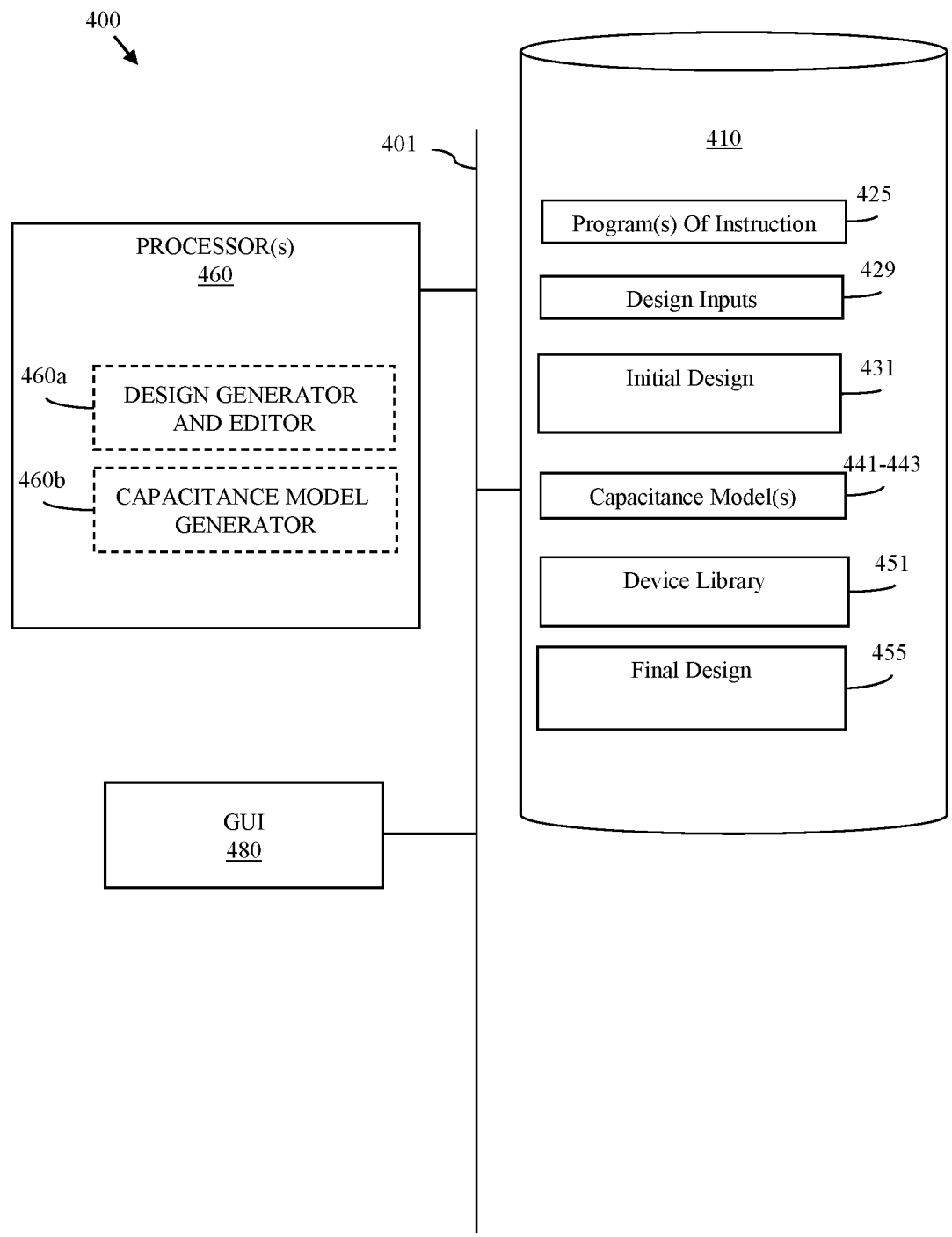
FIG. 4 is a schematic diagram illustrating embodiments of a disclosed system.

More particularly, the design system 400 can be a computer-aided design (CAD) system and, specifically, can incorporate at least one memory 410 (e.g., at least one computer readable storage medium, such as a computer readable storage device), a user interface 480 (e.g., a graphic user interface (GUI)) and at least one processor 460. Components of the design system 400, including the processor(s), memory(ies) and GUI, can be interconnected over a system bus 401, as illustrated. Alternatively, any one or more of the components of the design system 400 can communicate with any other component over a wired or wireless network. Memory 410 can store program(s) 425 of instruction (e.g., electronic design automation (EDA) tool(s)) for performing the various design processes described in detail below. As mentioned above, the design system 400 can incorporate at least one processor 460. Specifically, the design system 400 can incorporate a single specialized processor 460 (e.g., a single specialized computer processing unit) that, during wafer-scale chip design, performs (i.e., that is adapted to perform, that is configured to perform and/or that executes program(s) 425 of instructions to perform) multiple process steps, as described in detail below with regard to the method. Alternatively, the design system 400 can incorporate two or more specialized processors (e.g., see processors 460a and 460b) and, during design of the structure 100, each processor can perform (i.e., can be adapted to perform, can be configured to perform and/or can execute one or more specific programs 425 of instructions to perform) one or more of the multiple process steps, as described in detail below with regard to the method. For purposes of illustration, two different special purpose processors are shown in FIG. 4 including a design generator and editor 460a and a capacitance model generator 460b). It should be understood that FIG. 4 is not intended to be limiting and, additional special purpose processors could be incorporated into the design system 400 and/or the multiple process steps, as described in detail below, could be performed by any number of one or more processors.

The disclosed design method (e.g., as set forth in the flow diagram of FIG. 3) can be implemented using the design system 400 of FIG. 4.

Figure 3:
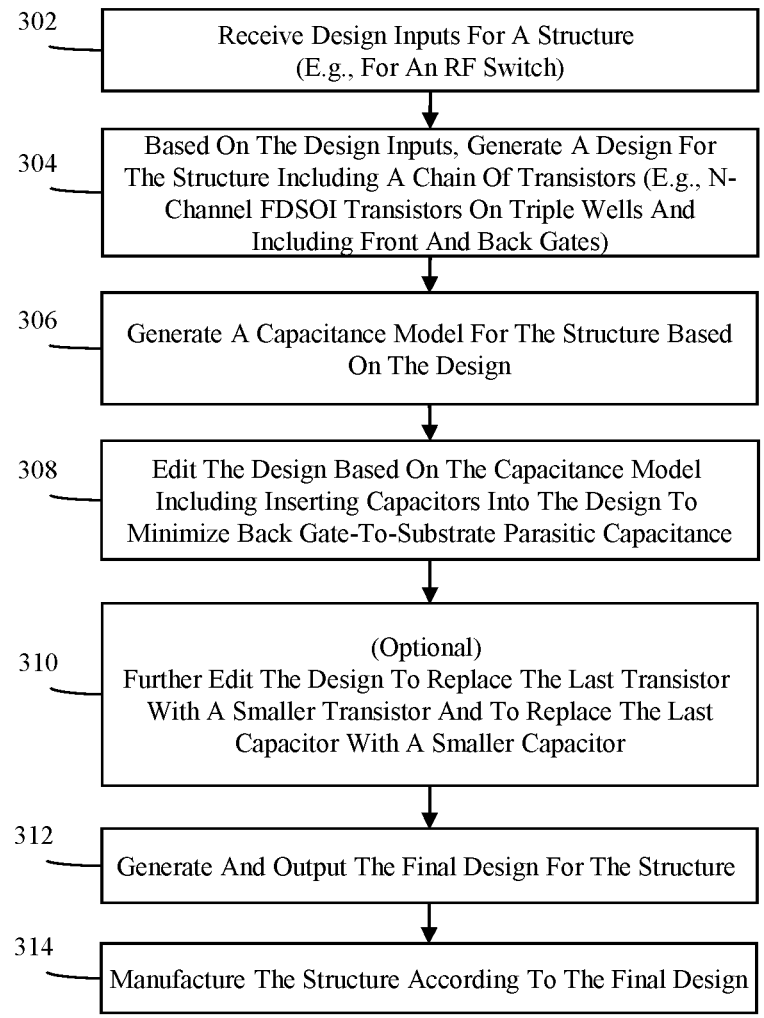
FIG. 3 is a flow diagram illustrating embodiments of a disclosed method.

Referring to FIGS. 3 and 4 in combination, the method can include receiving (e.g., by the design system 400 via the GUI 480) design inputs 429 and, particularly, design and performance specifications as well as operating parameters (e.g., voltage requirements, etc.) for the structure 100 (see process 302). The design inputs 429 can be stored in memory 410 (e.g., on a data storage device accessible by the processor(s)).

Figure 5:
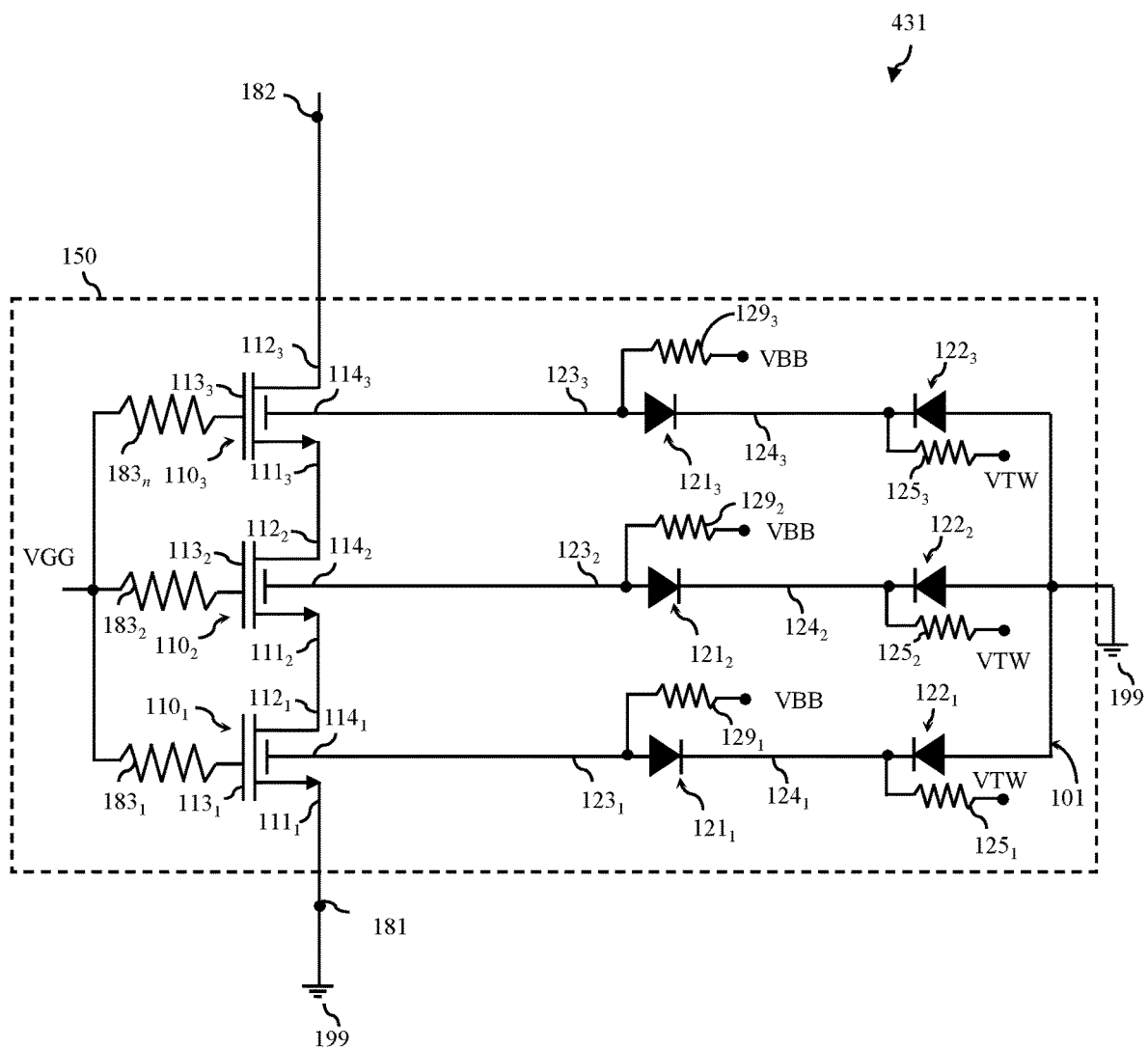
FIGS. 5-8 are schematic diagrams illustrating different processes in the disclosed method.

The method can include accessing the design inputs 429 from memory and using the design inputs 429 to generate (and store in memory) an initial design 431 for the structure 100 (see process 304 and FIG. 5). As illustrated, the initial design 431 can include a chain 150 of triple well transistors $110_1$-$110_n$ (as described in detail above with regard to FIGS. 1 and 2A-2B).

The transistors $110_1$-$110_n$ can be essentially identical, same size, transistors. The total number n of transistors $110_1$-$110_n$ can, for example, be based on the design inputs 429, such as the voltage requirement. As discussed above, higher voltage requirements may require more transistors in the chain 150. For purposes of illustration, the chain 150 in the initial design 431 includes only three transistors $110_1$-$110_3$. The initial design 431 is shown as being devoid capacitors. However, optionally, the initial design 431 can include capacitor placeholders without specific design information. Generation of the initial design 431 at process 304 can be performed using the design system 400 and, more particularly, can be performed automatically (e.g., based on automatic operations performed by processor 460 or, if applicable, by a design generator and editor 460a executing a program of instructions), can be performed based on designer selections and/or inputs (e.g., through the GUI 480), or can be performed based on a combination of automatic operations and designer selections and/or inputs.

Figure 6:
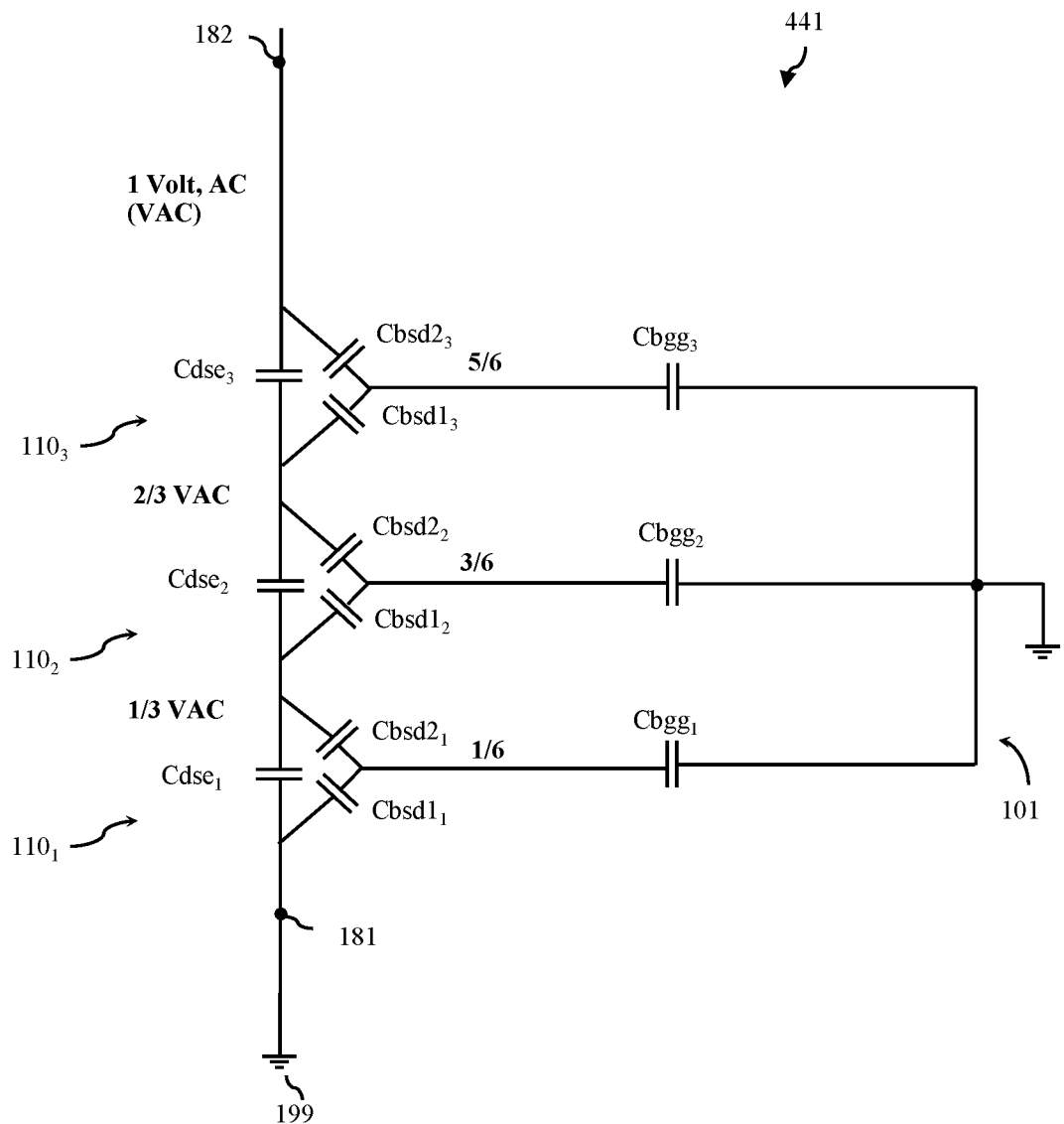

The method can further include generating (and storing in memory) a parasitic capacitance model 441 based on the initial design 431 (i.e., a compact model for the parasitic capacitances within the structure given the initial design) (see process 306 and FIG. 6). FIG. 6 is illustrative of a parasitic capacitance model 441 generated at process 306 for a structure that includes a chain 150 of three transistor $110_1$-$110_3$ between nodes 181-182, where 1 Volt, alternating current (AC) flows across the second node 182.

In any case under the above-mentioned frequency range assumption, gate-to-drain capacitance (Cgd) and gate-to-source capacitance (Cgs) appear in series, so the following equation applies:

$$Cdse = 1/(1/Cgs + 1/Cgd) + Cds, \quad (1)$$

where Cds refers to drain-to-source capacitance and Cdse refers to the effective drain-to-source capacitance. When all the transistors $110_1$-$110_n$ are same size transistors, these capacitance values (Cdse, Cgs, Cgd, and Cds) can be essentially the same for each transistor and the first body-to-source/drain capacitance (Cbsd1) and the second body-to-source/drain capacitance (Cbsd2) for each transistor can also be the same. Thus, the following formulas are applicable at process 306:

$$Ron_1 = Ron_2 = Ron_3 \quad (2)$$

$$Ron, \text{total} = Ron_1 + Ron_2 + Ron_3 = 3Ron, \quad (3)$$

$$Coff = (Cdse + 1/2Cbsd/3 + 1/[1/(5Cbgg) + 1/Cbgg] + \quad (4)$$
$$1/[1/(Cbgg) + 1/Cbgg] + 1/[1/(1/(5Cbgg) + 1/Cbgg] =$$
$$1/3Cdse + 1/6Cbsd + Cbgg[1/(1/5+1) + 1/2 + 1/7] = 1/3Cdse +$$
$$1/6Cbsd + Cbgg[5/6 + 1/2 + 1/7] = 1/3Cdse + 1/6Cbsd + 31/21Cbgg,$$

where Coff refers to the off-capacitance and where Cbgg refers to the secondary gate-to-substrate parasitic capacitance.

Generation of the parasitic capacitance model 441 at process 306 can be performed using the design system 400 and, more particularly, can be performed automatically (e.g., based on automatic operations performed by processor 460 or, if applicable, by a capacitance model generator 460b executing a program of instructions), can be performed based on designer selections and/or inputs (e.g., through the GUI 480), or can be performed based on a combination of automatic operations and designer selections and/or inputs.

Figure 7:
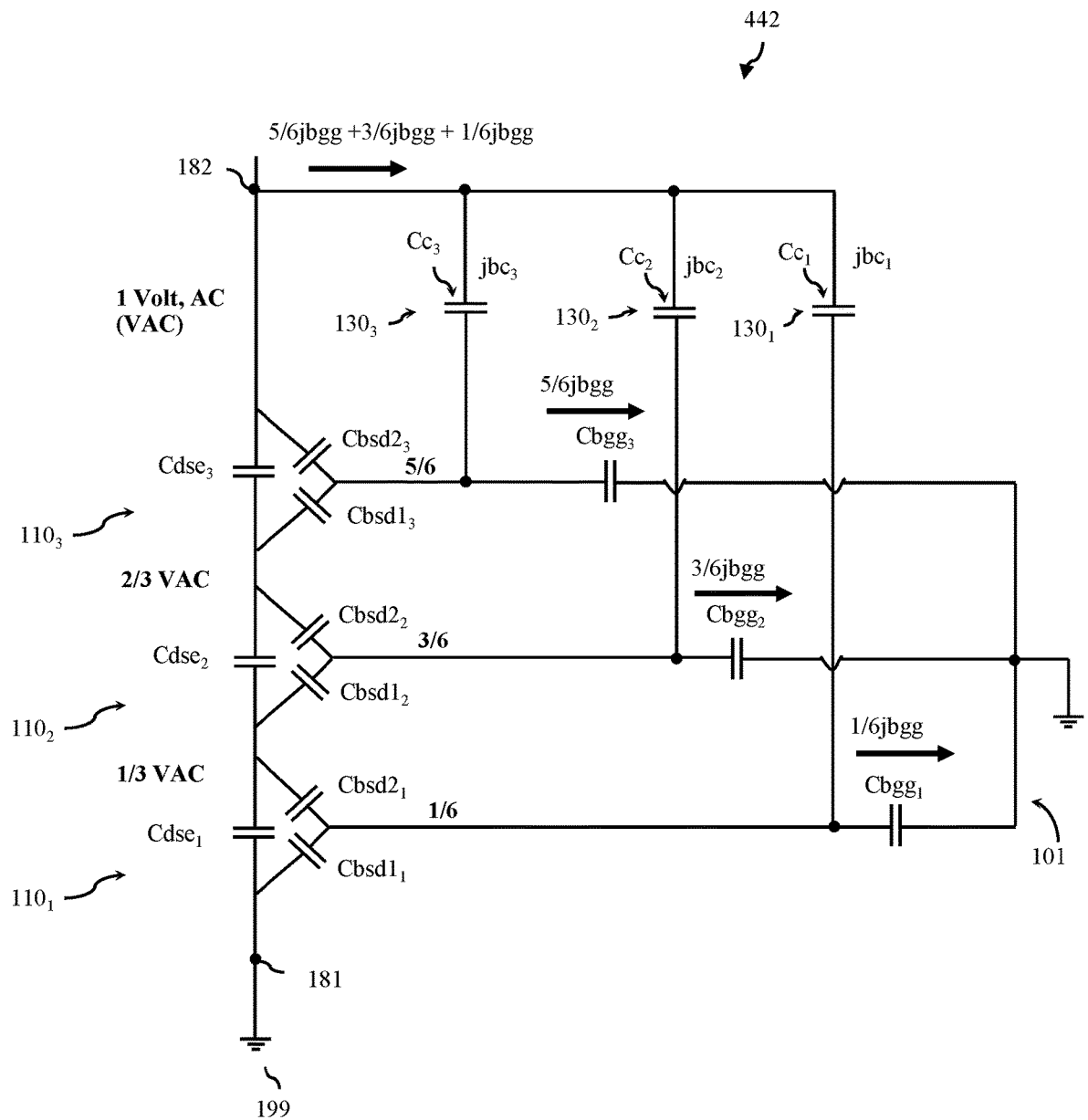

The method can further include editing the initial design 431 for the structure based on the parasitic capacitance model 441 (see process 308). Editing the initial design 431 at process 308 can include determining the optimal values for compensation capacitances (Cc) needed between the secondary gates $114_1$-$114_3$ and the second node 182 in order to compensate for the secondary gate-to-substrate parasitic capacitances (Cbggs) associated with the transistors $110_1$-$110_3$, respectively, and to be provided by inserting capacitors $130_1$-$130_3$ (i.e., $Cc_1$ by capacitor $130_1$, $Cc_2$ by capacitor $130_2$, and so on). Editing the initial design 431 at process 308 can further include generating (and storing in memory) an updated parasitic capacitance model 442, as shown in FIG. 7, that includes the compensation capacitances. The compensation capacitances can be different capacitances for the different capacitors and these different capacitances can be selected to limit secondary gate-to-substrate coupling, to be proportional to a secondary gate-to-substrate capacitance, and to increase between a first capacitor connected to the secondary gate of a first transistor at the first node and a last capacitor connected to the secondary gate of a last transistor at the second node.

More specifically, he following formulas are applicable at process 306 for further determining the optimal values for $Cc_1$, $Cc_2$, and $Cc_3$:

$$1/6 jbc_3 = 5/6 jbgg, \quad (5)$$

$$bc_3 = 5bgg, \quad (6)$$

$$Cc_3 = 5Cbgg, \quad (7)$$

$$3/6 jbc_2 = 3/6 jbgg \quad (8)$$

$$bc_2 = bgg, \quad (9)$$

$$Cc_2 = Cbgg, \quad (10)$$

$$5/6 jbc_1 = 1/6 jbgg, bc_1 = 1/5 bgg, \quad (11)$$

and $$Cc_1 = 1/5 Cbgg, \quad (12)$$

where $bc_1$-$bc_3$ as well as bgg are susceptances of the respective capacitors with $bc_1$ being equal to $\omega Cc_1$, $bc_2$ being equal to $\omega Cc_2$, $bc_3$ being equal to $\omega Cc_3$, and bgg being equal to $\omega Cbgg$, where $\omega$ is equal to $2\pi$ times the frequency (f) of the AC voltage, and where j is equal to the square root of $-1$.

Editing the initial design 431 at process 308 can further include selecting (e.g., from a device library 451) or custom-designing different size capacitors $130_1$-$130_3$. This process can be performed so the first capacitor $130_1$ is relatively small and has the capacitance $Cc_1$ (e.g., ⅕Cbgg), so the second capacitor $130_2$ is larger and has the capacitance $Cc_2$ (e.g., Cbgg), and the third capacitor $130_3$ is significantly larger than all other capacitors and has a capacitance $Cc_3$ (e.g., 5Cbgg). These different size capacitors $130_1$-$130_3$ can then be inserted into the design (e.g., as shown in the schematic diagram of FIG. 1).

Those skilled in the art will recognize that larger capacitors are required to achieve the larger capacitance values. Therefore, if the last capacitor, which is connected to the last transistor in the chain and which has the largest capacitance, consumes too much chip area, then additional design editing, including transistor size adjustments, can optionally be performed prior to generation of the final design at process (see process 310).

Figure 8:
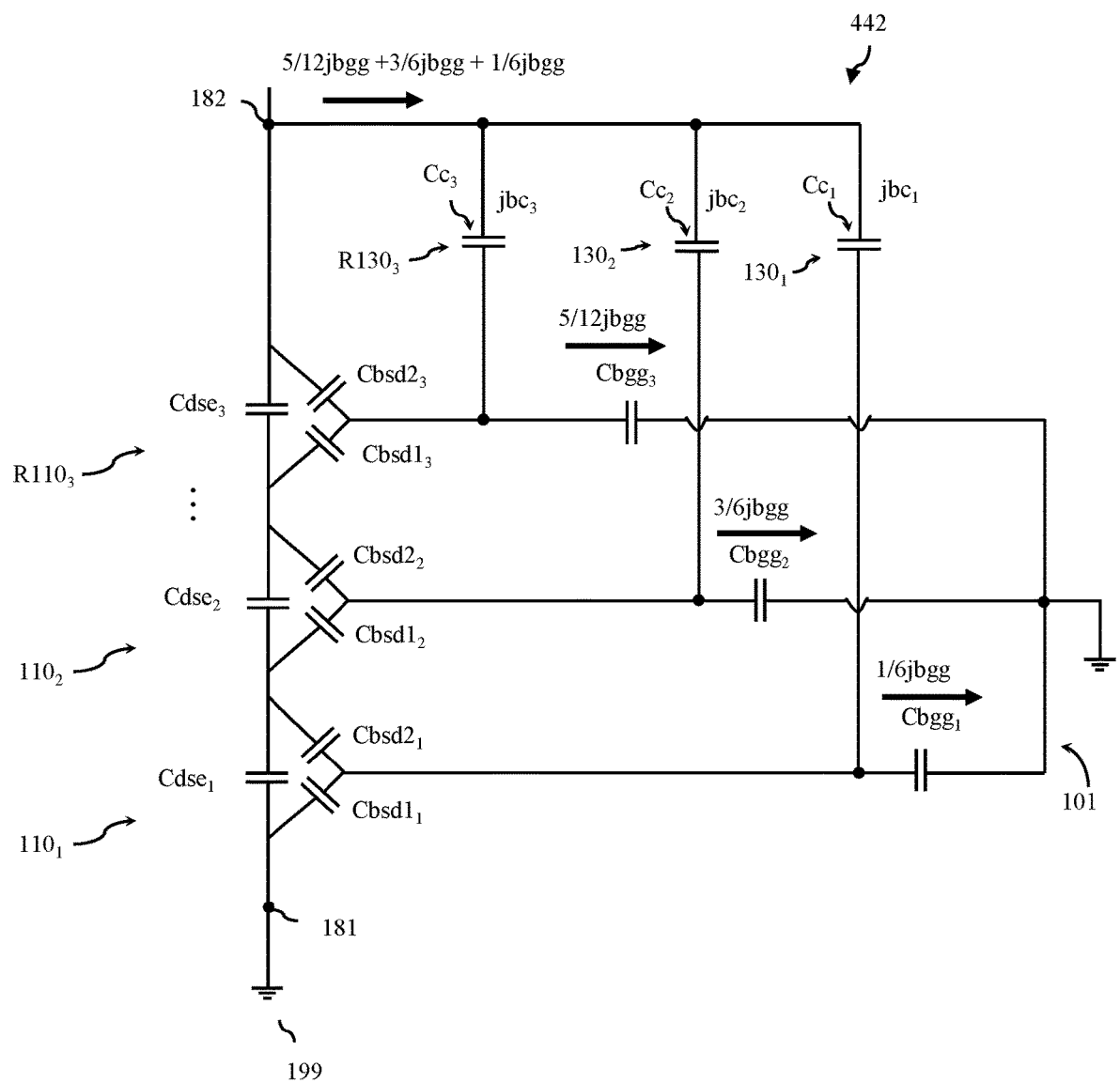

For example, in the above example, if the third capacitor 130₃ is too large, the third transistor 110₃ can be replaced by a replacement transistor R110₃, which is a smaller transistor (i.e., which is smaller in size, such as half the size, of the other transistors in the chain). Another updated parasitic capacitance model 443, as shown in FIG. 8, can be generated, and stored in memory. In this updated parasitic capacitance model 443, Cc₃ is reduced (e.g., by half if the third transistor 110₃ was reduced in size by half). Thus, the third capacitor 130₃ can be replaced by a smaller replacement capacitor R130₃. In the above example, Ron will increase due to the smaller replacement transistor R110₃, but only marginally. The following formulas apply to the above example (where the third transistor 110₃ is replaced with a replacement transistor R110₃ that is half the size) for updating the parasitic capacitance model including redetermining the optimal values for Cc₁-Cc₃:

$$Ron_1 = Ron_2 = 2Ron_3 \quad (13)$$

$$Ron, \text{total} = 4Ron, \quad (14)$$

$$Coff = (Cdse + 1/2Cbsd)/3 + 1/[1/(5/2Cbgg) + 1/Cbgg] + \quad (15)$$
$$1[1/Cbgg + 1/Cbgg] + 1/[1/(1/5Cbgg) + 1/Cbgg] =$$
$$1/3Cdse + 1/6Cbsd + Cbgg[1/(2/5 + 1) + 1/2 + 1/7] =$$
$$1/3Cdse + 1/6Cbsd + Cbgg[5/7 + 1/2 + 1/7] =$$
$$1/3Cdse + 1/6Cbsd + 19/14Cbgg,$$

$$1/6 jbc_3 = 5/12 jbgg, \quad (16)$$

$$bc_3 = 5/2bgg, \quad (17)$$

$$Cc_3 = 5/2Cbgg, \quad (18)$$

$$3/6 jbc_2 = 3/6 jbgg, \quad (19)$$

$$bc_2 = bgg, \quad (20)$$

$$Cc_2 = Cbgg, \quad (21)$$

$$5/6 jbc_1 = 1/6 jbgg, \quad (22)$$

$$bc_1 = 1/5bgg, \quad (23)$$

and $$Cc_1 = 1/5Cbgg, \quad (24)$$

where $bc_1$-$bc_3$ as well as bgg are susceptances of the respective capacitors with $bc_1$ being equal to $\omega Cc_1$, $bc_2$ being equal to $\omega Cc_2$, $bc_3$ being equal to $\omega Cc_3$, and bgg being equal to $\omega Cbgg$ where $\omega$ is equal to $2\pi$ times the frequency (f) of the AC voltage, and where j is equal to the square root of $-1$.

For the each of the three transistors 110₁-110₃, the parasitic capacitances that impact on resistance (Ron) include, but are not limited to, the drain-to-source capacitance (Cds), the gate-to-source capacitance (Cgs), the gate-to-drain capacitance (Cgd), the effective drain-to-source capacitance (Cdse), the first body-to-source/drain capacitance (Cbsd1), the second body-to-source/drain capacitance (Cbsd2), and the secondary gate-to-substrate capacitance (also referred to herein as a back gate-to-substrate capacitance) (Cbgg). Cdse is formed by the back gate capacitors in parallel with Cds. Ron refers to on resistance and Coff refers to off capacitance.

Additionally, for each transistor 110₁-110ₙ, the primary gate 113₁-113ₙ is biased through a corresponding resistor 183₁-183ₙ with a relatively large resistance (Rgg) and for frequencies well above Rgg, Cgs is essentially an open circuit. It should be understood that for the various parameters discussed herein, subscripts of 1, 2, . . . n associated with a parameter identify the device to which that particular parameter is associated (e.g., Ron₁ refers to on resistance of transistor 110₁, Ron₂ refers to on resistance of transistor 110₂, and so on; Cgs₁ refers to gate to source capacitance of transistor 110₁, Cgs₂ refers to gate to source capacitance of transistor 110₂, and so on; etc.).

The above example for optionally performing additional editing at process 310 is not intended to be limiting. If multiple capacitors that have been inserted into the design at process 308 consume too much chip area, then additional design editing at process 310 can optionally be performed to replace multiple transistors in the chain so with smaller transistors (e.g., so that in the resulting structure the transistors progressively decrease in size). As a result, the compensation capacitances (Ccs) needed to minimize the secondary gate-to-substrate capacitances associated with some of the transistors will be reduced, as will the sizes of the capacitors connected to those capacitors.

Processes 308-310 can be performed automatically (e.g., based on automatic operations performed by processor 460 or, if applicable, iteratively by the design generator and editor 460a and the capacitance model generator 460b executing a program of instructions), can be performed based on designer selections and/or inputs (e.g., through the GUI 480), or can be performed based on a combination of automatic operations and designer selections and/or inputs.

It should be noted that processes 306-310 are described above with respect to an initial design that includes a simple three-transistor chain (i.e., a chain with transistors 110₁-110₃). It should be understood that the description of the method with respect to a three-transistor chain and the corresponding figures are not intended to be limiting. Processes 306-310 could be applied to an initial design that includes a chain with any number n of transistors (e.g., a 6-transistor chain). Furthermore, the formulas mentioned above can be modified to achieve finer granularity given the configuration of the capacitors 130₁-130ₙ to be employed (e.g., APMOM capacitors on triple wells that will be biased with a positive voltage).

Figure 9:
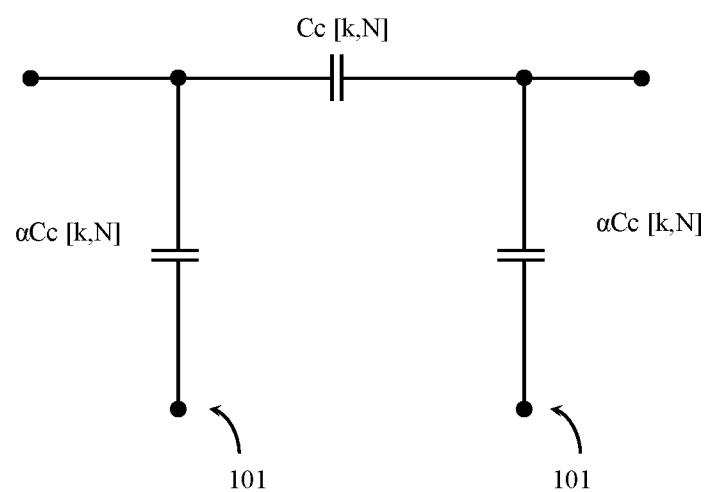
FIG. 9 is a schematic diagram illustrating a capacitance model for a polarity metal-oxide-metal (APMOM) capacitor.

For example, FIG. 9 is an illustration of a capacitance model, where Cc [k,N] is the intentional compensation capacitance for a capacitor k for a transistor stack height N, where $\alpha$ Cc[k,N] is the substrate parasitic capacitance that is a fraction of the intentional compensation capacitance and where the following equation applies:

$$cc2[k, N] := \frac{(-1 + 2k)cb[k, N]}{1 - 2k + 2N + \alpha [k] - 2k \alpha [k]}. \quad (25)$$

This can put a severe limitation on the maximum stack height, N, that can be compensated. For example, in a six-transistor stack compensation cannot be achieved, if $\alpha$ approaches 1/11. If APMOM capacitors on biasable triple wells are employed for the compensation capacitors, $\alpha$ can be significantly reduced, thereby allowing a larger maximum compensated stack height, N, and lower overall capacitances. For example, consider a six-transistor stack (i.e., a chain that includes six transistors 110₁-110₆), where the corresponding compensation capacitors 130₁-130₆ are APMOM capacitors on triple wells that are biasable by a positive voltage. In this case, the compensation capacitances for each capacitor k ($130_1$-$130_6$) could be determined as follows:

| k | Cc[k, 6] | |
|---|---|---|
| 6 | $\dfrac{11\,cb[6,\,6]}{1-11\,\alpha\,[6]}$, | (26) |
| 5 | $\dfrac{9cb[5,\,6]}{3-9\,\alpha\,[5]}$, | (27) |
| 4 | $\dfrac{7cb[4,\,6]}{5-7\,\alpha\,[4]}$, | (28) |
| 3 | $\dfrac{5cb[3,\,6]}{7-5\,\alpha\,[3]}$, | (29) |
| 2 | $\dfrac{3cb[2,\,6]}{9-3\,\alpha\,[2]}$, and | (30) |
| 1 | $\dfrac{cb[1,\,6]}{11\,\alpha\,[1]}$, | (31) | where cb is the parasitic capacitance from the transistor to ground/substrate.

Following processes 306-310, a final design 455 for the structure 100 can be generated (and stored in memory) (see process 312). The final design 455 can subsequently be output and the structure can be manufactured according to the final design 455 (see process 314).

It should be understood that the above-described design method can be implemented using, for example, the above-described design system in combination with one or more computer program product(s). A computer program product may include a computer readable storage medium (or media) having computer readable program instructions thereon for causing a processor to conduct aspects of the present disclosure. The present disclosure may be a system, a method, and/or a computer program product. The computer program product may include a computer readable storage medium (or media) having computer readable program instructions thereon for causing a processor to conduct aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or conduct combinations of special purpose hardware and computer instructions.

Figure 10:
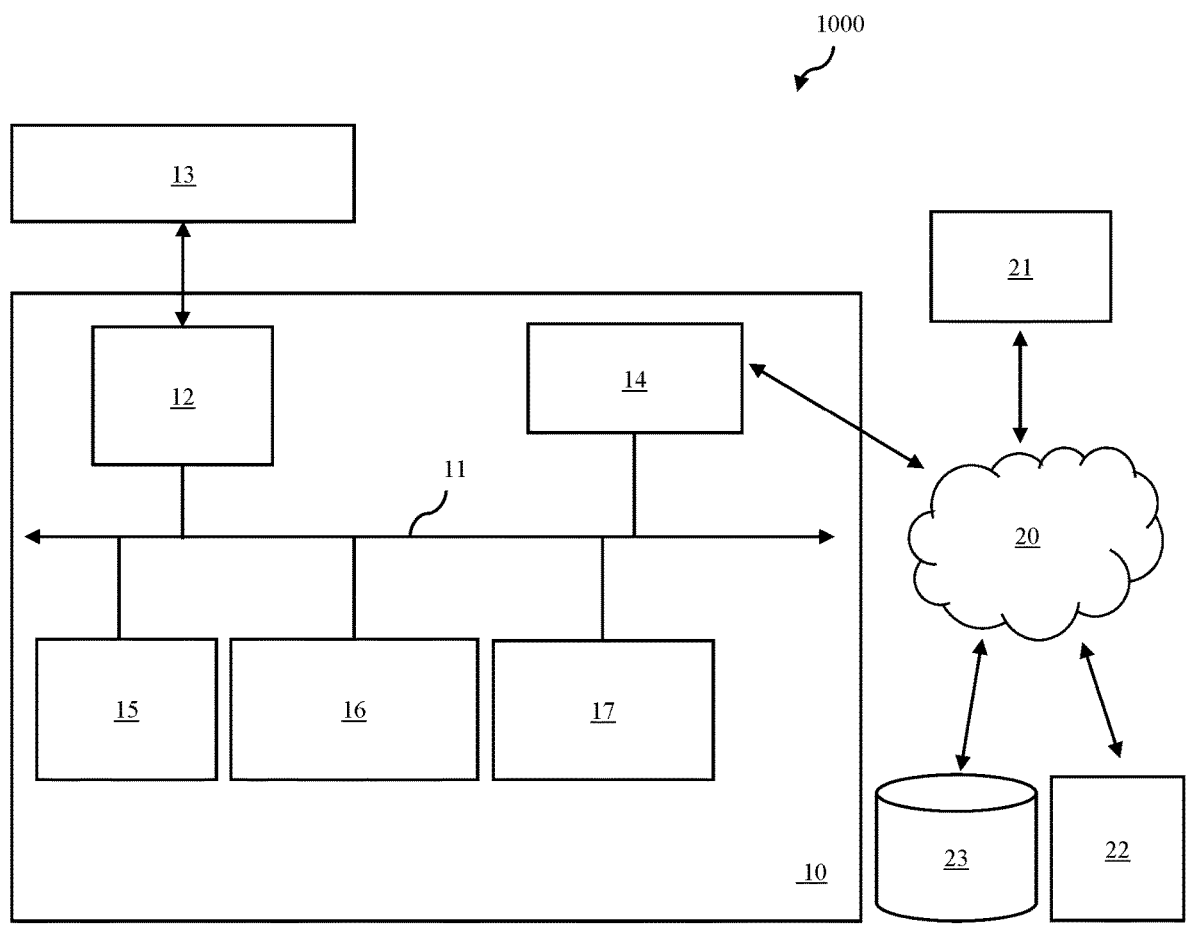
FIG. 10 is a schematic diagram illustrative of a hardware environment for implementing aspects of the disclosed embodiments.

An illustrative hardware environment 1000 for implementing aspects of the disclosed methods, systems, and computer program products is depicted in FIG. 10. Generally, the hardware environment can include at least one computing device 10 (also referred to herein as a computer). Computer 10 can be, for example, a desktop, laptop, tablet, mobile computing device, etc. Computer 10 can include at least one bus 11. Bus 11 can be connected to various other components of the computer 10 and can be configured to facilitate communication between those components.

The computer 10 can include various adapters. The adapters can include one or more peripheral device adapters 12, which are configured to facilitate communications between one or more peripheral devices 13, respectively, and the bus 11. Peripheral devices 13 can include user input devices configured to receive user inputs. User input devices can include, but are not limited to, a keyboard, a mouse, a microphone, a touchpad, a touchscreen, a stylus, biosensor, a scanner, or any other type of user input device. Peripheral devices 13 can also include additional input devices, such as external secondary memory devices (as discussed in greater detail below). The peripheral devices 13 can also include output devices. The output devices can include, but are not limited to, a printer, a monitor, a speaker, or any other type of computer output device. The adapters can include one or more communications adapters 14 (also referred to herein as a computer network adapters), which are configured to facilitate communications between the computer 10 and one or more communications networks 20 (e.g., a wide area network (WAN), a local area network (LAN), the internet, a cellular network, a Wi-Fi network, etc.). Such network(s) 20 can, in turn, facilitate communications between the computer 10 and other system components on the network: remote server(s) 21, other device(s) 22 (e.g., computers, laptops, tablets, mobile phones, etc.), remote data storage 23, etc.

The computer 10 can further include at least one processor 15 (also referred to herein as a central processing unit (CPU)). Optionally, each CPU 15 can include a CPU cache. Each CPU 15 can be configured to read and execute program instructions.

The computer 10 can further include memory and, particularly, computer-readable storage mediums. The memory can include primary memory 16 and secondary memory. The primary memory 16 can include, but is not limited to, random access memory (RAM) (e.g., volatile memory employed during execution of program operations) and read only memory (ROM) (e.g., non-volatile memory employed during start-up). The RAM can include, but is not limited to, dynamic random access memory (DRAM), static random access memory (SRAM), or any other suitable type of RAM. The ROM can include, but is not limited to, erasable programmable read only memory (EPROM), flash memory, electronically erasable programmable read only memory (EEPROM), programmable read only memory (PROM), or any other suitable type of ROM. The secondary memory can be non-volatile. The secondary memory can include internal secondary memory 17, such as internal solid state drive(s) (SSD(s)) and/or internal hard disk drive(s) (HDD(s), installed within the computer 10 and connected to the bus 11. The secondary memory can also include external secondary memory connected to or otherwise in communication with the computer 10 (e.g., peripheral devices). The external secondary memory can include, for example, external/portable SSD(s), external/portable HDD(s), flash drive(s), thumb drives, compact disc(s) (CD(s)), digital video disc(s) (DVD(s)), network-attached storage (NAS), storage area network (SAN), or any other suitable non-transitory computer-readable storage media connected to or otherwise in communication with the computer 10. The different functions of primary and secondary memory are well known in the art and, thus, the details thereof have been omitted from this specification in order to allow the reader to focus on the salient aspects of the disclosed embodiments.

In some embodiments, program instructions for performing the disclosed method or a portion thereof, as described above, can be embodied in (e.g., stored in) secondary memory accessible by computer 10. When the program instructions are to be executed (e.g., in response to user inputs to the computer 10), required information (e.g., the program instructions and other data) can be loaded into the primary memory (e.g., stored in RAM). The CPU 15 can read the program instructions and other data from the RAM and can execute the program instructions. In other embodiments, a client-server model can be employed. In this case, the computer 10 can be a client and a remote server 21 in communication with the computer 10 over a network 20 can provide, to the client, a service including execution of program instructions for performing the disclosed method or a portion thereof, as described above, in response to user inputs the computer 10.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   transistors connected in series between a first node and a second node, wherein;
   each transistor has a primary gate and a secondary gate,
   the transistors include at least a first transistor connected to the first node and a last transistor connected to the second node, and
   the first transistor and any additional transistors up to the last transistor are same size transistors and are larger than the last transistor; and
   capacitors, wherein each capacitor is electrically connected directly to the second node and to the secondary gate of a corresponding one of the transistors.

2. The structure of claim 1, wherein the capacitors have different capacitances.

3. The structure of claim 2,
   wherein the different capacitances of the capacitors compensate for secondary gate-to-substrate parasitic capacitances and increase between a first capacitor connected to the secondary gate of the first transistor and a last capacitor connected to the secondary gate of the last transistor.

4. The structure of claim 1, wherein primary gates of the transistors are connected to receive a primary gate voltage and wherein secondary gates of the transistors are connected to receive a secondary gate voltage.

5. The structure of claim 1,
   wherein the transistors include N-channel fully depleted silicon-on-insulator field effect transistors on triple wells, and
   wherein the capacitors include alternate polarity metal-oxide-metal capacitors on additional triple wells.

6. A structure comprising:
   a semiconductor substrate having a first surface and a second surface opposite the first surface, wherein the semiconductor substrate includes:
      well regions at the second surface, extending a first depth into the semiconductor substrate, and physically separated from the first surface; and
      additional well regions, wherein the additional well regions are within the well regions, respectively, at the second surface, have a different type conductivity than the well regions, and extend a second depth into the semiconductor substrate, wherein the second depth is less than the first depth;
   an insulator layer on the second surface;
   a semiconductor layer on the insulator layer;
   transistors connected in series between a first node and a second node, wherein each transistor includes:
      an active device region in the semiconductor layer;
      a primary gate on the active device region opposite the insulator layer; and
      a secondary gate including a section of the insulator layer adjacent to the active device region and one of the additional well regions; and
   capacitors, wherein each capacitor is electrically connected directly to the second node and to the one of the additional well regions of the secondary gate of a corresponding one of the transistors
   wherein the transistors include at least a first transistor connected to the first node and a last transistor connected to the second node, and
      wherein the first transistor and any additional transistor up to the last transistor are same size transistors and are larger than the last transistor.

7. The structure of claim 6,
   wherein the capacitors have different capacitances.

8. The structure of claim 6, wherein primary gates of the transistors are connected to receive a primary gate voltage and wherein secondary gates of the transistors are connected to receive a secondary gate voltage.

9. The structure of claim 6, further comprising isolation regions extending into the semiconductor substrate from the second surface and positioned laterally adjacent to the additional well regions.

10. The structure of claim 6,
    wherein the transistors include N-channel fully depleted silicon-on-insulator field effect transistors on triple wells, and
    wherein the capacitors include alternate polarity metal-oxide-metal capacitors on additional triple wells.

11. A method comprising:
    generating, by a processor, a capacitance model for a structure including transistors connected in series between a first node and a second node, wherein:
       each transistor has a primary gate and a secondary gate,
       the transistors include at least a first transistor connected to the first node and a last transistor connected to the second node, and
       the transistors are initially same size transistors; and editing, by the processor, a design for the structure based on the capacitance model, wherein the editing includes inserting capacitors into the design with each capacitor being connected directly to the second node and to the secondary gate of a corresponding one of the transistors and replacing the last transistor with a smaller transistor and further replacing the last capacitor with a smaller capacitor; and outputting, by the processor, the design for manufacturing the structure.

12. The method of claim 11,
wherein the inserting of the capacitors includes selecting different size capacitors with different capacitances for insertion, and.

13. The structure of claim 7,
wherein the different capacitances compensate for secondary gate-to-substrate parasitic capacitances and increase between a first capacitor connected to the secondary gate of the first transistor and a last capacitor connected to the secondary gate of the last transistor.

14. The method of claim 12,
wherein the different capacitances are selected to limit secondary gate-to-substrate coupling, to be proportional to a secondary gate-to-substrate capacitance, and to increase between a first capacitor connected to the secondary gate of a first transistor at the first node and a last capacitor connected to the secondary gate of a last transistor at the second node.

15. The method of claim 11,
wherein primary gates of the transistors are connected to receive a primary gate voltage and wherein secondary gates of the transistors are connected to receive a secondary gate voltage.

16. The method of claim 11,
wherein the transistors include N-channel fully depleted silicon-on-insulator field effect transistors on triple wells, and
wherein the capacitors include alternate polarity metal-oxide-metal capacitors on additional triple wells.

* * * * *

UNITED STATES PATENT AND TRADEMARK OFFICE
CERTIFICATE OF CORRECTION

PATENT NO. : 12,355,431 B2  
APPLICATION NO. : 18/158572  
DATED : July 8, 2025  
INVENTOR(S) : Thomas G. McKay et al.

Page 1 of 1

It is certified that error appears in the above-identified patent and that said Letters Patent is hereby corrected as shown below:

In the Claims

Column 23, In Claim 12, Line 14 reads "…"insertion, and"…" but it should read "insertion."……"

Signed and Sealed this
Fifth Day of August, 2025

Coke Morgan Stewart
*Acting Director of the United States Patent and Trademark Office*